(12) United States Patent
Wang et al.

(10) Patent No.: US 11,562,205 B2
(45) Date of Patent: Jan. 24, 2023

(54) PARALLEL PROCESSING OF A CONVOLUTIONAL LAYER OF A NEURAL NETWORK WITH COMPUTE-IN-MEMORY ARRAY

(71) Applicant: QUALCOMM Incorporated, San Diego, CA (US)

(72) Inventors: Zhongze Wang, San Diego, CA (US); Ye Lu, San Diego, CA (US)

(73) Assignee: Qualcomm Incorporated, San Diego, CA (US)

(*) Notice: Subject to any disclaimer, the term of this patent is extended or adjusted under 35 U.S.C. 154(b) by 709 days.

(21) Appl. No.: 16/576,597

(22) Filed: Sep. 19, 2019

(65) Prior Publication Data
US 2021/0089865 A1    Mar. 25, 2021

(51) Int. Cl.
*G06N 3/04* (2006.01)
*G06F 7/544* (2006.01)
*G06F 17/15* (2006.01)

(52) U.S. Cl.
CPC ......... *G06N 3/0454* (2013.01); *G06F 7/5443* (2013.01); *G06F 17/15* (2013.01)

(58) Field of Classification Search
CPC .............. G06N 3/0454; G06N 3/0481; G06N 3/0635; G06F 7/5443; G06F 17/15; G11C 11/419; G11C 7/1006; G11C 11/54
See application file for complete search history.

(56) References Cited

U.S. PATENT DOCUMENTS

| 10,381,074 | B1* | 8/2019 | Kim | ..................... | G11C 13/003 |
| 10,446,231 | B2* | 10/2019 | Hosokawa | ............. | G06N 3/063 |
| 2016/0328645 | A1* | 11/2016 | Lin | ........................... | G06N 3/08 |
| 2019/0042199 | A1 | 2/2019 | Sumbul et al. | | |
| 2019/0042251 | A1* | 2/2019 | Nurvitadhi | .......... | G06F 15/7821 |
| 2019/0102359 | A1* | 4/2019 | Knag | ....................... | G06G 7/16 |
| 2019/0103156 | A1* | 4/2019 | Sumbul | ............... | G11C 7/1006 |
| 2019/0332925 | A1* | 10/2019 | Modha | ................... | G06N 3/063 |

(Continued)

OTHER PUBLICATIONS

Anonymous: "Convolutional Neural Network", Wikipedia, Sep. 4, 2019 (Sep. 4, 2019), XP055730463, 28 pages, Retrieved from the Internet: URL: https://en.wikipedia.org/w/index.php?title=Convolutional_neural_network&oldid=914010072. [retrieved on Sep. 14, 2020] p. 4, line 15-line 23.

(Continued)

*Primary Examiner* — Bobbak Safaipour
(74) *Attorney, Agent, or Firm* — Seyfarth Shaw LLP

(57) ABSTRACT

An apparatus includes first and second compute-in-memory (CIM) arrays. The first CIM array is configured to store weights corresponding to a filter tensor, to receive a first set of activations corresponding to a first receptive field of an input, and to process the first set of activations with the weights to generate a corresponding first tensor of output values. The second CIM array is configured to store a first copy of the weights corresponding to the filter tensor and to receive a second set of activations corresponding to a second receptive field of the input. The second CIM array is also configured to process the second set of activations with the first copy of the weights to generate a corresponding second tensor of output values. The first and second compute-in-memory arrays are configured to process the first and second receptive fields in parallel.

20 Claims, 10 Drawing Sheets

(56) References Cited

U.S. PATENT DOCUMENTS

| | | | |
|---|---|---|---|
| 2019/0332941 A1* | 10/2019 | Towal | G06N 3/084 |
| 2020/0117981 A1* | 4/2020 | Arthur | G06N 3/0481 |
| 2020/0242458 A1* | 7/2020 | Manipatruni | G06F 17/16 |
| 2020/0342938 A1* | 10/2020 | Tran | G11C 16/26 |
| 2020/0364577 A1* | 11/2020 | Le Gallo-Bourdeau | G06N 3/084 |
| 2020/0410318 A1* | 12/2020 | del Mundo | G06F 17/15 |
| 2021/0089865 A1* | 3/2021 | Wang | G06N 3/0635 |
| 2022/0191553 A1* | 6/2022 | Auyeung | H04N 19/635 |
| 2022/0300418 A1* | 9/2022 | Baugh | G06F 12/0284 |

OTHER PUBLICATIONS

International Search Report and Written Opinion—PCT/US2020/051275—ISA/EPO—dated Dec. 14, 2020.

Yasmin H., et al., "ReRAM-based In-Memory Computing for Search Engine and Neural Network Applications", Piscataway, NJ, USA, pp. 388-397, XP011729345, ISSN: 2156-3357, DOI: 10.1109/JETCAS.2019.2909317 [retrieved on Jun. 10, 2019], IEEE Journal on Emerging and Selected Topics in Circuits and Systems, IEEE, vol. 9, No. 2, Apr. 4, 2019, (Apr. 4, 2019), 10 pages.

\* cited by examiner

PARALLEL PROCESSING OF A CONVOLUTIONAL LAYER OF A NEURAL NETWORK WITH COMPUTE-IN-MEMORY ARRAY

BACKGROUND

Field

Aspects of the present disclosure generally relate to parallel processing of a convolutional layer of a neural network with compute-in-memory array.

Background

Conventionally, a convolutional layer in a convolutional neural network (CNN) uses small size filters. However, convolutional neural networks sometimes have a very large number of input and output channels. Thus, the filters are re-used multiple times in multiply and accumulate (MAC) operations to generate all the output, which takes numerous cycles and is time consuming.

In some digital implementations (e.g., thirty-two-bit-or-less digital implementation), the filter of the convolutional neural network may be digitally cloned. While digitally cloning the filter reduces the cycle of the convolutional neural network, digitally cloning filters significantly increases power consumption. This follows because the digital cloning process involves moving the filter weight and activation in parallel, which consume a large amount of energy in a short time period.

SUMMARY

An apparatus includes first and second compute-in-memory (CIM) arrays. The first CIM array is configured to store multiple weights corresponding to a filter tensor, to receive a first set of activations corresponding to a first receptive field of an input and to process the first set of activations with the weights to generate a corresponding first tensor of output values. The second CIM array is configured to store a first copy of the weights corresponding to the filter tensor, to receive a second set of activations corresponding to a second receptive field of the input, and to process the second set of activations with the first copy of the weights to generate a corresponding second tensor of output values. The first compute-in-memory array and the second compute-in-memory array are configured to process the first receptive field and second receptive field in parallel.

A processing method for a convolutional layer of a convolutional neural network includes storing multiple weights corresponding to a filter tensor in a first compute-in-memory array. The method also includes receiving a first set of activations corresponding to a first receptive field of an input by the first compute-in-memory array. The method includes storing a first copy of the weights corresponding to the filter tensor in a second compute-in-memory array. The method further includes receiving a second set of activations corresponding to a second receptive field of the input by the second compute-in-memory array. Furthermore, the method includes processing, in the first compute-in-memory array, the first set of activations with the weights to generate a corresponding first tensor of output values and processing, in the second compute-in-memory array, the second set of activations with the first copy of the weights to generate a corresponding second tensor of output values. The first compute-in-memory array and the second compute-in-memory array are configured to process the first receptive field and the second receptive field in parallel.

An apparatus includes first and second means for performing bitwise operations and bit counts on a set of activations. The first means is configured to store multiple weights corresponding to a filter tensor, to receive a first set of activations corresponding to a first receptive field of an input and to process the first set of activations with the weights to generate a corresponding first tensor of output values. The second means is configured to store a first copy of the weights corresponding to the filter tensor, to receive a second set of activations corresponding to a second receptive field of the input, and to process the second set of activations with the first copy of the weights to generate a corresponding second tensor of output values. The first means and the second means are configured to process the first receptive field and second receptive field in parallel.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout.

DETAILED DESCRIPTION

Figure 1:
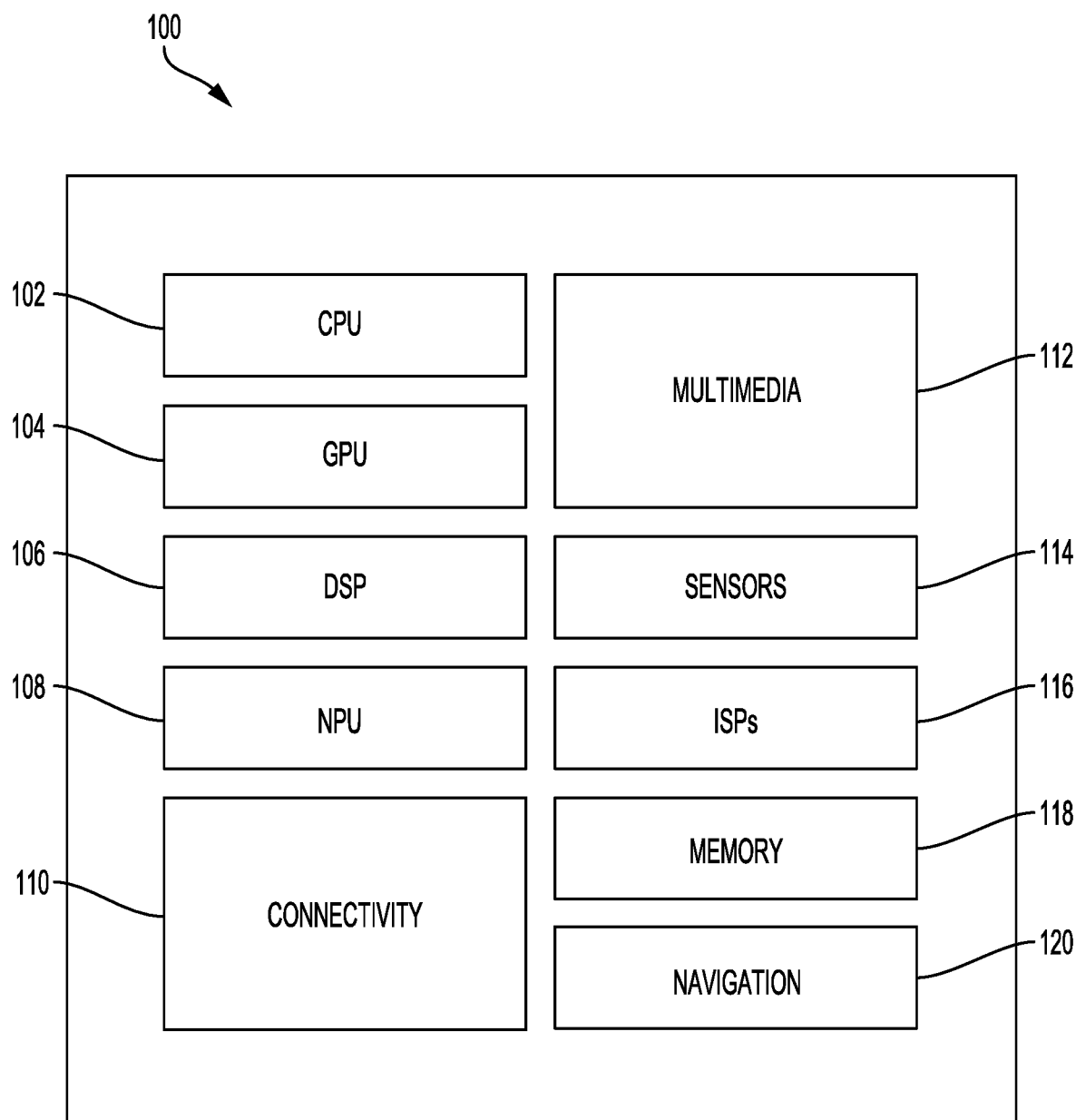
FIG. 1 illustrates an example implementation of designing a neural network using a system-on-a-chip (SOC), including a general-purpose processor in accordance with certain aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Based on the teachings, one skilled in the art should appreciate that the scope of the disclosure is intended to cover any aspect of the disclosure, whether implemented independently of or combined with any other aspect of the disclosure. For example, an apparatus may be implemented or a method may be practiced using any number of the aspects set forth. In addition, the scope of the disclosure is intended to cover such an apparatus or method practiced using other structure, functionality, or structure and functionality in addition to or other than the various aspects of the disclosure set forth. It should be understood that any aspect of the disclosure disclosed may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses or objectives. Rather, aspects of the disclosure are intended to be broadly applicable to different technologies, system configurations, networks and protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Conventionally, a convolutional layer in a convolutional neural network (CNN) uses small size filters. However, convolutional neural networks sometimes have a very large number of input and output channels. Thus, the filters are re-used multiple times in multiply and accumulate (MAC) operations to generate all the output, which takes numerous cycles and is time consuming.

In some digital implementations (e.g., thirty-two-bit-or-less digital implementation), the filter of the convolutional neural network may be cloned digitally. While digitally cloning the filter reduces the cycle of the convolutional neural network, digitally cloning filters significantly increases power consumption. This follows because the digital cloning process involves moving the filter weight and activation in parallel, which consume a large amount of energy in a short time period.

A binary neutral network (BNN) having binary activation and weights, operating in accordance with aspects of the present disclosure, achieves accuracy that is sufficient for most artificial intelligence (AI) tasks. Compute-in-memory (CIM), as an analog implementation, is one of the best ways to implement a BNN. Using the BNN allows replacing MAC operations with bit-wise operations like XNOR and bit counts. Implementing a BNN in a CIM allows for power and time savings. That is, each storage unit is also a computation unit. One of the advantages of a compute-in-memory binary neutral network is energy/power reduction.

Aspects of the present disclosure are directed to cloning or replicating the convolution layer filter/weight and performing parallel multiply and accumulate functions according to a compute-in-memory implementation. A convolutional layer in which the parallel processing is performed may be part of a binary neural network. In one aspect, an array of weights corresponding to a filter implemented in a compute-in-memory array is received and loaded into multiple bit cells of the compute-in-memory array. The filter and its corresponding weights are replicated. Parallel convolutional layer multiply and accumulate (MAC) functions are then performed with the filter and the replica(s) of the filter. An output is simultaneously generated from each of the filter and the replica(s) of the filter.

In one aspect, performing parallel convolutional layer multiply and accumulate (MAC) functions with the filter and the replica(s) of the filter includes receiving a first receptive field input that is a portion of an entire input to be processed by the convolutional layer. The method also includes receiving a second receptive field input that is another portion of the entire input to be processed by the convolutional layer. The first receptive field input and the second receptive field input are simultaneously processed with the filter and the replica(s) of the filter, respectively. The parallel processing is analog within the compute-in-memory array.

Aspects of the present disclosure reduce cycle time of the convolutional layer of the neural network by at least four times (4x) while maintaining competitive energy/power consumption compared to an alternative digital implementation. For example, aspects of the present disclosure can achieve energy savings of more than twice that of the digital implementation (e.g., a one-bit logic implementation without parallel processing) or seven times that of a one-bit logic with parallel processing.

FIG. 1 illustrates an example implementation of a system-on-a-chip (SOC) 100, which may include a central processing unit (CPU) 102 or a multi-core CPU configured for parallel processing of a convolutional layer of a convolutional neural network in accordance with certain aspects of the present disclosure. Variables (e.g., neural signals and synaptic weights), system parameters associated with a computational device (e.g., neural network with weights), delays, frequency bin information, and task information may be stored in a memory block associated with a neural processing unit (NPU) 108, in a memory block associated with a CPU 102, in a memory block associated with a graphics processing unit (GPU) 104, in a memory block associated with a digital signal processor (DSP) 106, in a memory block 118, or may be distributed across multiple blocks. Instructions executed at the CPU 102 may be loaded from a program memory associated with the CPU 102 or may be loaded from a memory block 118.

The SOC 100 may also include additional processing blocks tailored to specific functions, such as a GPU 104, a DSP 106, a connectivity block 110, which may include fifth generation (5G) connectivity, fourth generation long term evolution (4G LTE) connectivity, Wi-Fi connectivity, USB connectivity, Bluetooth connectivity, and the like, and a multimedia processor 112 that may, for example, detect and recognize gestures. In one implementation, the NPU is implemented in the CPU, DSP, and/or GPU. The SOC 100 may also include a sensor processor 114, image signal processors (ISPs) 116, and/or navigation module 120, which may include a global positioning system.

The SOC 100 may be based on an ARM instruction set. In an aspect of the present disclosure, the instructions loaded into the general-purpose processor 102 may include code to receive an array of weights corresponding to a filter of a compute-in-memory array. The general-purpose processor 102 may also include code to load the array of weights into multiple bit cells of the compute-in-memory array for the filter. The general-purpose processor 102 may further include code to replicate the filter. Furthermore, the general-purpose processor 102 may include code to perform parallel convolutional layer multiply and accumulate (MAC) functions with the filter and the replica of the filter of the compute-in-memory array.

Deep learning architectures may perform an object recognition task by learning to represent inputs at successively higher levels of abstraction in each layer, thereby building up a useful feature representation of the input data. In this way, deep learning addresses a major bottleneck of traditional machine learning. Prior to the advent of deep learning, a machine learning approach to an object recognition problem may have relied heavily on human engineered features, perhaps in combination with a shallow classifier. A shallow classifier may be a two-class linear classifier, for example, in which a weighted sum of the feature vector components may be compared with a threshold to predict to which class the input belongs. Human engineered features may be templates or kernels tailored to a specific problem domain by engineers with domain expertise. Deep learning architectures, in contrast, may learn to represent features that are similar to what a human engineer might design, but through training. Furthermore, a deep network may learn to represent and recognize new types of features that a human might not have considered.

A deep learning architecture may learn a hierarchy of features. If presented with visual data, for example, the first layer may learn to recognize relatively simple features, such as edges, in the input stream. In another example, if presented with auditory data, the first layer may learn to recognize spectral power in specific frequencies. The second layer, taking the output of the first layer as input, may learn to recognize combinations of features, such as simple shapes for visual data or combinations of sounds for auditory data. For instance, higher layers may learn to represent complex shapes in visual data or words in auditory data. Still higher layers may learn to recognize common visual objects or spoken phrases.

Deep learning architectures may perform especially well when applied to problems that have a natural hierarchical structure. For example, the classification of motorized vehicles may benefit from first learning to recognize wheels, windshields, and other features. These features may be combined at higher layers in different ways to recognize cars, trucks, and airplanes.

Neural networks may be designed with a variety of connectivity patterns. In feed-forward networks, information is passed from lower to higher layers, with each neuron in a given layer communicating to neurons in higher layers.

A hierarchical representation may be built up in successive layers of a feed-forward network, as described above. Neural networks may also have recurrent or feedback (also called top-down) connections. In a recurrent connection, the output from a neuron in a given layer may be communicated to another neuron in the same layer. A recurrent architecture may be helpful in recognizing patterns that span more than one of the input data chunks that are delivered to the neural network in a sequence. A connection from a neuron in a given layer to a neuron in a lower layer is called a feedback (or top-down) connection. A network with many feedback connections may be helpful when the recognition of a high-level concept may aid in discriminating the particular low-level features of an input.

Figure 2A:
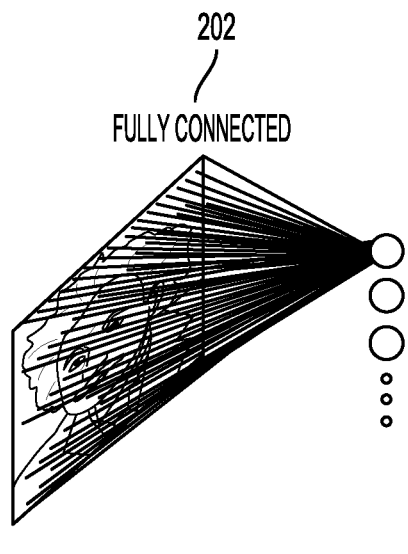
FIGS. 2A, 2B, and 2C are diagrams illustrating a neural network in accordance with aspects of the present disclosure.
Figure 2B:
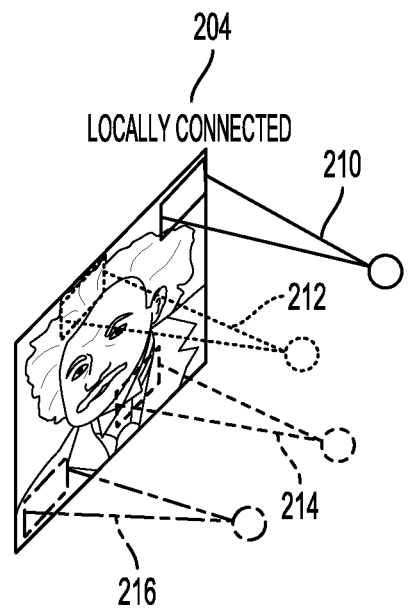

The connections between layers of a neural network may be fully connected or locally connected. FIG. 2A illustrates an example of a fully connected neural network 202. In a fully connected neural network 202, a neuron in a first layer may communicate its output to every neuron in a second layer, so that each neuron in the second layer will receive input from every neuron in the first layer. FIG. 2B illustrates an example of a locally connected neural network 204. In a locally connected neural network 204, a neuron in a first layer may be connected to a limited number of neurons in the second layer. More generally, a locally connected layer of the locally connected neural network 204 may be configured so that each neuron in a layer will have the same or a similar connectivity pattern, but with connections strengths that may have different values (e.g., 210, 212, 214, and 216). The locally connected connectivity pattern may give rise to spatially distinct receptive fields in a higher layer, because the higher layer neurons in a given region may receive inputs that are tuned through training to the properties of a restricted portion of the total input to the network.

Figure 2C:
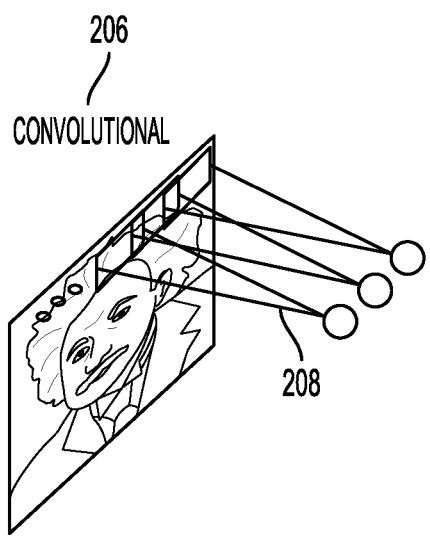

One example of a locally connected neural network is a convolutional neural network. FIG. 2C illustrates an example of a convolutional neural network 206. The convolutional neural network 206 may be configured such that the connection strengths associated with the inputs for each neuron in the second layer are shared (e.g., 208). Convolutional neural networks may be well suited to problems in which the spatial location of inputs is meaningful.

Figure 2D:
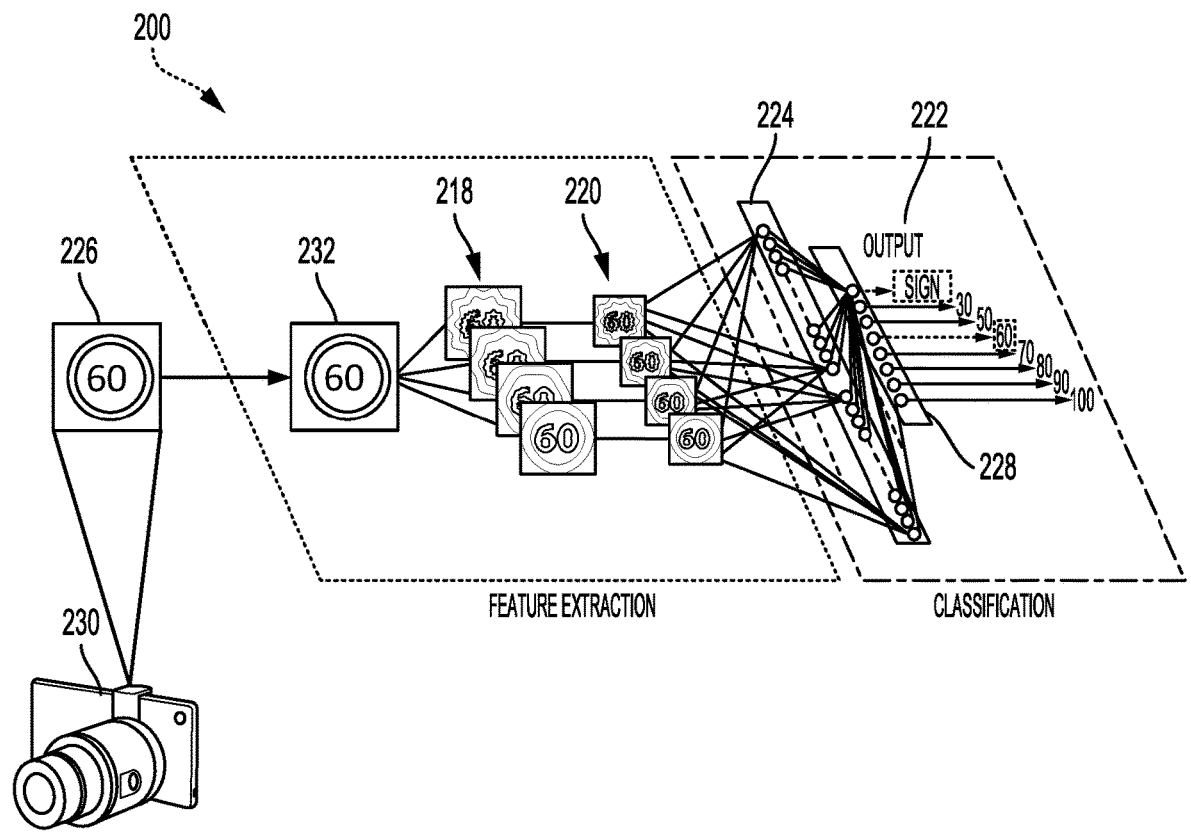
FIG. 2D is a diagram illustrating an exemplary deep convolutional network (DCN) in accordance with aspects of the present disclosure.

One type of convolutional neural network is a deep convolutional network (DCN). FIG. 2D illustrates a detailed example of a DCN 200 designed to recognize visual features from an image 226 input from an image capturing device 230, such as a car-mounted camera. The DCN 200 of the current example may be trained to identify traffic signs and a number provided on the traffic sign. Of course, the DCN 200 may be trained for other tasks, such as identifying lane markings or identifying traffic lights.

The DCN 200 may be trained with supervised learning. During training, the DCN 200 may be presented with an image, such as the image 226 of a speed limit sign, and a forward pass may then be computed to produce an output 222. The DCN 200 may include a feature extraction section and a classification section. Upon receiving the image 226, a convolutional layer 232 may apply convolutional kernels (not shown) to the image 226 to generate a first set of feature maps 218. As an example, the convolutional kernel for the convolutional layer 232 may be a 5×5 kernel that generates 28×28 feature maps. In the present example, because four different feature maps are generated in the first set of feature maps 218, four different convolutional kernels were applied to the image 226 at the convolutional layer 232. The convolutional kernels may also be referred to as filters or convolutional filters.

The first set of feature maps 218 may be subsampled by a max pooling layer (not shown) to generate a second set of feature maps 220. The max pooling layer reduces the size of the first set of feature maps 218. That is, a size of the second set of feature maps 220, such as 14×14, is less than the size of the first set of feature maps 218, such as 28×28. The reduced size provides similar information to a subsequent layer while reducing memory consumption. The second set of feature maps 220 may be further convolved via one or more subsequent convolutional layers (not shown) to generate one or more subsequent sets of feature maps (not shown).

In the example of FIG. 2D, the second set of feature maps 220 is convolved to generate a first feature vector 224. Furthermore, the first feature vector 224 is further convolved to generate a second feature vector 228. Each feature of the second feature vector 228 may include a number that corresponds to a possible feature of the image 226, such as "sign," "60," and "100." A softmax function (not shown) may convert the numbers in the second feature vector 228 to a probability. As such, an output 222 of the DCN 200 is a probability of the image 226 including one or more features.

In the present example, the probabilities in the output 222 for "sign" and "60" are higher than the probabilities of the others of the output 222, such as "30," "40," "50," "70," "80," "90," and "100". Before training, the output 222 produced by the DCN 200 is likely to be incorrect. Thus, an error may be calculated between the output 222 and a target output. The target output is the ground truth of the image 226 (e.g., "sign" and "60"). The weights of the DCN 200 may then be adjusted so the output 222 of the DCN 200 is more closely aligned with the target output.

To adjust the weights, a learning algorithm may compute a gradient vector for the weights. The gradient may indicate an amount that an error would increase or decrease if the weight were adjusted. At the top layer, the gradient may correspond directly to the value of a weight connecting an activated neuron in the penultimate layer and a neuron in the output layer. In lower layers, the gradient may depend on the value of the weights and on the computed error gradients of the higher layers. The weights may then be adjusted to reduce the error. This manner of adjusting the weights may be referred to as "back propagation" as it involves a "backward pass" through the neural network.

In practice, the error gradient of weights may be calculated over a small number of examples, so that the calculated gradient approximates the true error gradient. This approximation method may be referred to as stochastic gradient descent. Stochastic gradient descent may be repeated until the achievable error rate of the entire system has stopped decreasing or until the error rate has reached a target level. After learning, the DCN may be presented with new images (e.g., the speed limit sign of the image 226) and a forward pass through the network may yield an output 222 that may be considered an inference or a prediction of the DCN.

Deep belief networks (DBNs) are probabilistic models comprising multiple layers of hidden nodes. DBNs may extract a hierarchical representation of training data sets. A DBN may be obtained by stacking up layers of Restricted Boltzmann Machines (RBMs). An RBM is a type of artificial neural network that can learn a probability distribution over a set of inputs. Because RBMs can learn a probability distribution in the absence of information about the class to which each input should be categorized, RBMs are often used in unsupervised learning. Using a hybrid unsupervised and supervised paradigm, the bottom RBMs of a DBN may be trained in an unsupervised manner and may serve as feature extractors, and the top RBM may be trained in a supervised manner (on a joint distribution of inputs from the previous layer and target classes) and may serve as a classifier.

Deep convolutional networks (DCNs) are networks of convolutional networks, configured with additional pooling and normalization layers. DCNs have achieved state-of-the-art performance on many tasks. DCNs can be trained using supervised learning in which both the input and output targets are known for many exemplars and are used to modify the weights of the network by use of gradient descent methods.

DCNs may be feed-forward networks. In addition, as described above, the connections from a neuron in a first layer of a DCN to a group of neurons in the next higher layer are shared across the neurons in the first layer. The feed-forward and shared connections of DCNs may be exploited for fast processing. The computational burden of a DCN may be much less, for example, than that of a similarly sized neural network that comprises recurrent or feedback connections.

The processing of each layer of a convolutional network may be considered a spatially invariant template or basis projection. If the input is first decomposed into multiple channels, such as the red, green, and blue channels of a color image, then the convolutional network trained on that input may be considered three-dimensional, with two spatial dimensions along the axes of the image and a third dimension capturing color information. The outputs of the convolutional connections may be considered to form a feature map in the subsequent layer, with each element of the feature map (e.g., 220) receiving input from a range of neurons in the previous layer (e.g., feature maps 218) and from each of the multiple channels. The values in the feature map may be further processed with a non-linearity, such as a rectification, max(0, x). Values from adjacent neurons may be further pooled, which corresponds to down sampling, and may provide additional local invariance and dimensionality reduction. Normalization, which corresponds to whitening, may also be applied through lateral inhibition between neurons in the feature map.

The performance of deep learning architectures may increase as more labeled data points become available or as computational power increases. Modern deep neural networks are routinely trained with computing resources that are thousands of times greater than what was available to a typical researcher just fifteen years ago. New architectures and training paradigms may further boost the performance of deep learning. Rectified linear units may reduce a training issue known as vanishing gradients. New training techniques may reduce over-fitting and thus enable larger models to achieve better generalization. Encapsulation techniques may abstract data in a given receptive field and further boost overall performance.

Figure 3:
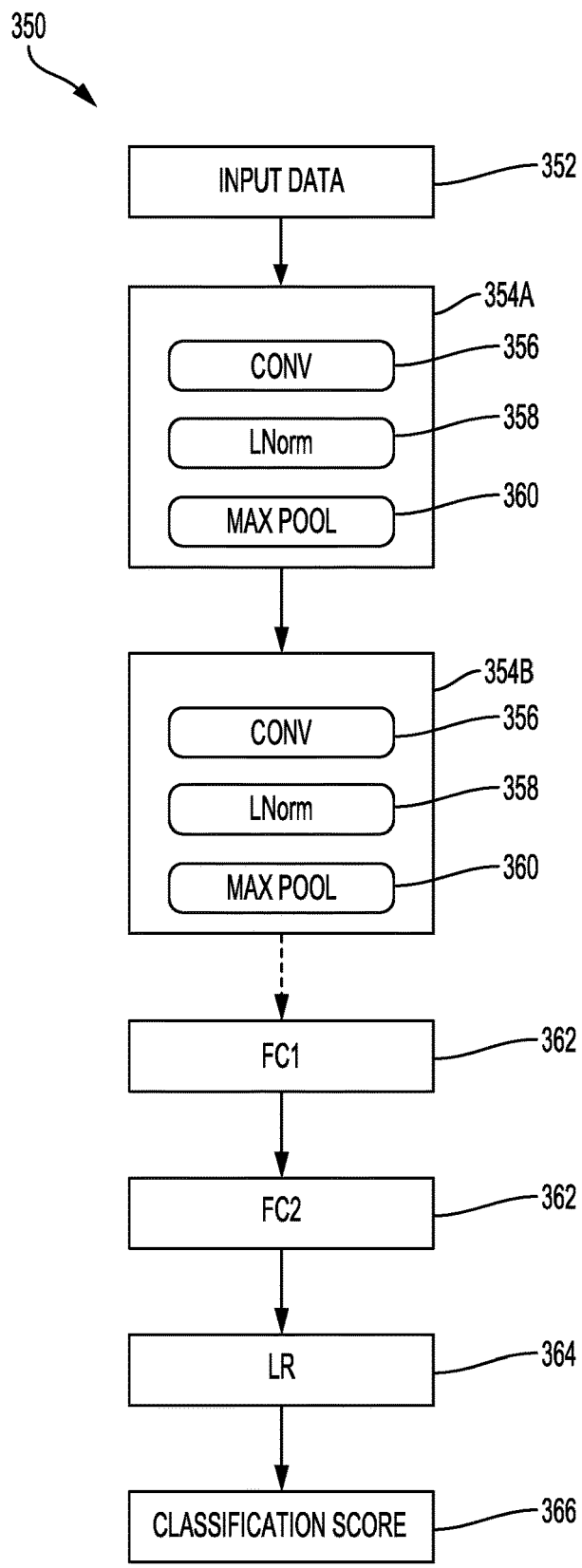
FIG. 3 is a block diagram illustrating an exemplary deep convolutional network (DCN) in accordance with aspects of the present disclosure.

FIG. 3 is a block diagram illustrating a deep convolutional network 350. The deep convolutional network 350 may include multiple different types of layers based on connectivity and weight sharing. As shown in FIG. 3, the deep convolutional network 350 includes the convolution blocks 354A, 354B. Each of the convolution blocks 354A, 354B may be configured with a convolution layer (CONV) 356, a normalization layer (LNorm) 358, and a max pooling layer (MAX POOL) 360.

The convolution layers 356 may include one or more convolutional filters, which may be applied to the input data to generate a feature map. Although only two of the convolution blocks 354A, 354B are shown, the present disclosure is not so limiting, and instead, any number of the convolution blocks 354A, 354B may be included in the deep convolutional network 350 according to design preference. The normalization layer 358 may normalize the output of the convolution filters. For example, the normalization layer 358 may provide whitening or lateral inhibition. The max pooling layer 360 may provide down sampling aggregation over space for local invariance and dimensionality reduction.

The parallel filter banks, for example, of a deep convolutional network may be loaded on a CPU 102 or GPU 104 of an SOC 100 to achieve high performance and low power consumption. In alternative embodiments, the parallel filter banks may be loaded on the DSP 106 or an ISP 116 of an SOC 100. In addition, the deep convolutional network 350 may access other processing blocks that may be present on the SOC 100, such as sensor processor 114 and navigation module 120, dedicated, respectively, to sensors and navigation.

The deep convolutional network 350 may also include one or more fully connected layers 362 (FC1 and FC2). The deep convolutional network 350 may further include a logistic regression (LR) layer 364. Between each layer 356, 358, 360, 362, 364 of the deep convolutional network 350 are weights (not shown) that are to be updated. The output of each of the layers (e.g., 356, 358, 360, 362, 364) may serve as an input of a succeeding one of the layers (e.g., 356, 358, 360, 362, 364) in the deep convolutional network 350 to learn hierarchical feature representations from input data 352 (e.g., images, audio, video, sensor data and/or other input data) supplied at the first of the convolution blocks 354A. The output of the deep convolutional network 350 is a classification score 366 for the input data 352. The classification score 366 may be a set of probabilities, where each probability is the probability of the input data including a feature from a set of features.

Figure 4:
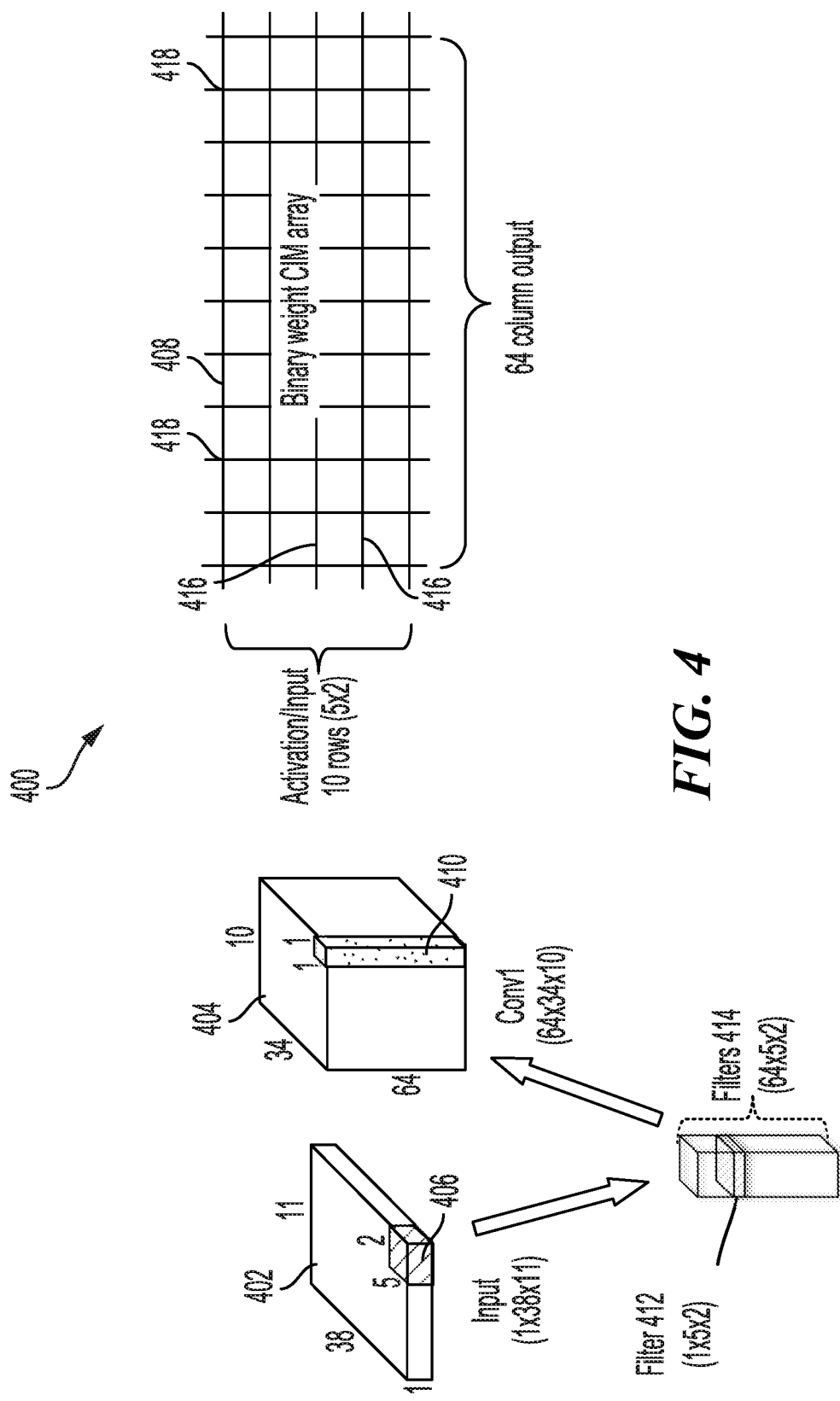
FIG. 4 illustrates an exemplary convolutional layer architecture having a compute-in-memory (CIM) array.

FIG. 4 illustrates an exemplary convolutional layer architecture 400 having a compute-in-memory array 408. The convolutional layer architecture 400 is part of a convolutional neural network (e.g., a binary neural network or a convolutional neural network 200 of FIG. 2). The convolutional neural network may be designed with multidemensional (tensor) data. For example, an input 402 of the convolutional layer architecture 400 has dimensions of one by thirty-eight by eleven (1 (depth)×38 (height)×11 (width)). A first layer or convolutional layer one (illustrated by the convolutional layer architecture 400) has sixty four (64) output channels and, correspondingly, 64 filters, represented by the filter tensor 414.

Each filter, e.g., exemplary filter 412, of the 64 filters of filter tensor 414, has dimensions of one by five by two (1×5×2) (all together, the filters or filter tensor 414 are equivalent to one 64×5×2 filter). Each 1×5×2 filter, e.g., filter 412, is convolved with the input 402 to generate one 1×34×10 layer of output 404 (all together, output 404 has dimensions 64×34×10). Each layer of the output 404 specifies three thousand four hundred (3400) multiply and accumulate (MAC), or equivalent, operations for 340 5×2 receptive fields (e.g. the receptive field input 406) and the corresponding filter, e.g., filter 412. Each value of output 404 specifies ten multiplications (of a 5×2 filter by a 5×2 receptive field). For example, every 5×2 filter convolves with 5×2 activations (10 MAC) to generate an output value (e.g., a number) in the output 404.

The six hundred and forty (640) weights of all the filters 414 (64×5×2) may be stored in the compute-in-memory (CIM) array 408. Then, three hundred and forty (340) times, the ten (10) activations of each of the 340 5×2 receptive fields (e.g., receptive field input 406) are input to the CIM array 408 using the word lines, e.g., 416, and multiplied by the corresponding weights to produce a 1×1×64 output tensor (e.g., an output tensor 410). A total output tensor 404 is an accumulation of the 1×1×64 output tensors for all of the receptive fields (e.g., the receptive field input 406) of the input 402. For simplicity, the compute-in-memory array 408 of FIG. 4 only shows a few illustrative lines for the input and the output of the compute-in-memory array 408.

The compute-in-memory array 408 includes wordlines 416 (e.g., word lines corresponding to rows of the compute-in-memory array 408) through which the CIM array 408 receives the receptive fields (e.g., receptive field input 406) as well as bitlines 418 (corresponding to the columns of the compute-in-memory array 408). The compute-in-memory array 408 also includes population count wordlines (PCWL) and read word lines RWL (not illustrated in FIG. 4 but illustrated in FIG. 7). The wordline 416 is used for initial weight definition. However, once the initial weight definition occurs, the activation input activates a specially designed line in the CIM bit cell for the MAC operation, which corresponds to the PCWL. Each intersection of a bitline 418 and a wordline 416 represents a filter weight value, which is multiplied by the input activation on the wordline 416 to generate a product. The individual products along each bitline 418 are then summed to generate corresponding output values of the output tensor 410. The summed value may be charge, current, or voltage. In each operating cycle, the ten values of a corresponding receptive field are input on the wordlines 416.

Multiplications performed in the compute-in-memory array 408 are summed and output at the bitlines 418 of the compute-in-memory array 408. The dimensions of the output tensor 404 after processing the entire input 402 of the convolutional layer are sixty-four by thirty-four by ten (64×34×10). However, only 64 filter outputs at a time are generated by the compute-in-memory array 408. Thus, multiply and accumulate operation for the whole input 402 may be delayed because only ten values of the corresponding receptive field of the entire input 402 are input in the wordlines in each operating cycle, which results in an increased number of cycles to process the entire input 402. For example, the processing of the entire input 402 may be completed in 34×10 or 340 cycles. Thus, the filters are re-used multiple times in multiply and accumulate (MAC) operations to generate all the output 404, which takes numerous cycles and is time consuming.

Figure 5:
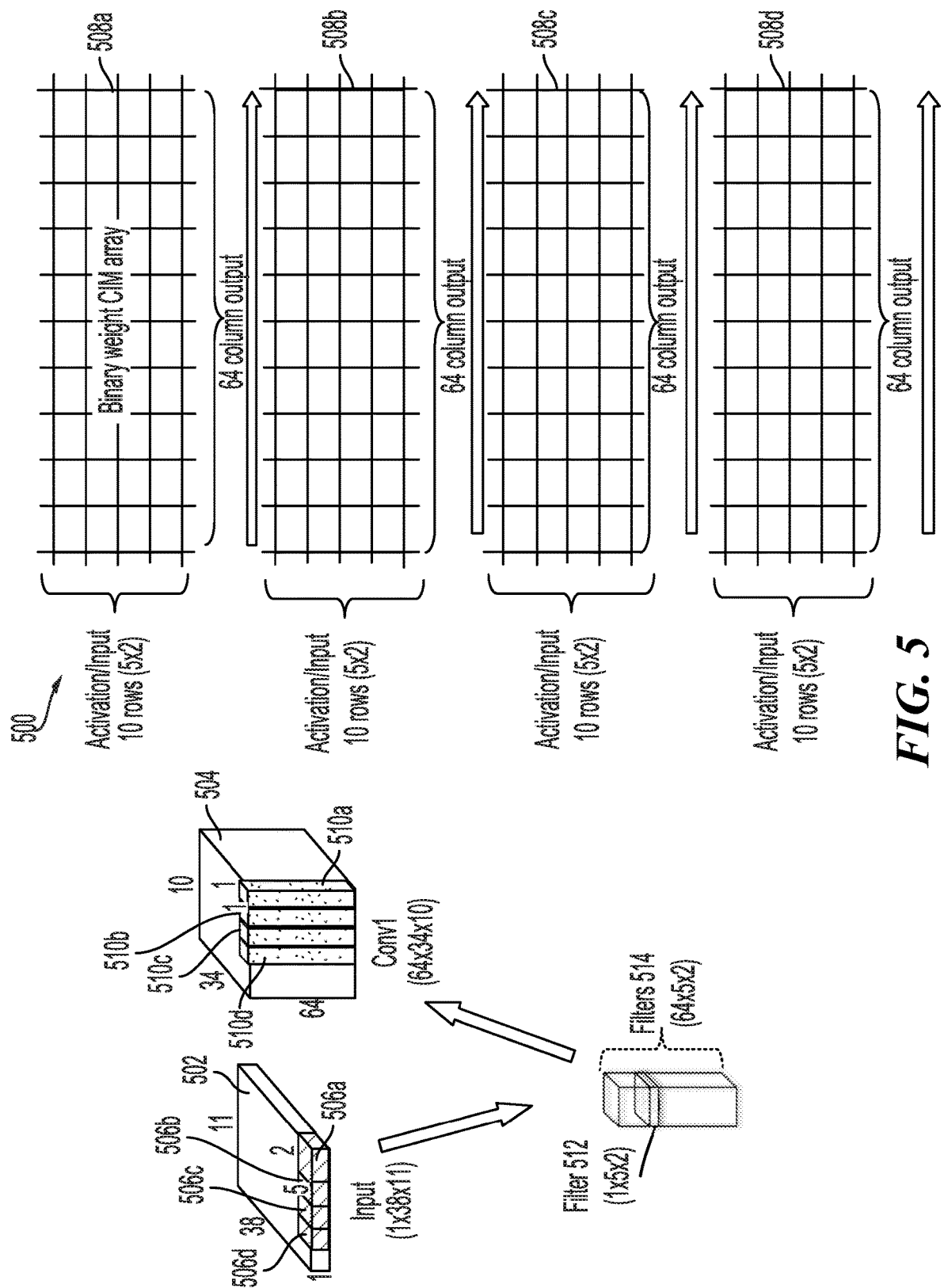
FIG. 5 illustrates a neural network architecture for compute-in-memory (CIM) parallel processing in a convolutional layer, according to aspects of the present disclosure.

FIG. 5 illustrates an exemplary neural network architecture 500 for compute-in-memory parallel processing in a convolutional layer, according to aspects of the present disclosure. For illustrative purposes, some of the devices and features of FIG. 4 are similar to those of FIG. 5. The convolutional layer includes multiple (e.g., four) parallel compute-in-memory arrays 508a, 508b, 508c, and 508d to simultaneously process multiple receptive field inputs of the entire input 502 in parallel. Each of the parallel compute-in-memory arrays 508a, 508b, 508c, and 508d may be similar to the compute-in-memory array 408 of FIG. 4. The input 502 may be similar to the input 402 of FIG. 4.

In one aspect, the compute-in-memory arrays 508a, 508b, 508c, and 508d are replicas of (or copies of) each other. Each filter, e.g., exemplary filter 512, of each of the compute-in-memory arrays 508a, 508b, 508c, and 508d has a dimension of one by five by two (1×5×2) (all together, sixty four (64) filters of the filter tensor 514, are equivalent to one 64×5×2 filter). Using each of the compute-in-memory arrays 508a, 508b, 508c, and 508d, the six hundred and forty (640) weights of all the filters (64×5×2) are stored in each of the compute-in-memory arrays 508a, 508b, 508c, and 508d. Thus, the compute-in-memory arrays 508a, 508b, 508c, and 508d include an array of weights corresponding to filters that are the same as the array of weights corresponding to filters of the compute-in-memory array 408.

The multiple receptive field inputs of the entire input 502 may include a first receptive field input 506a (e.g., similar to the receptive field input 406 of FIG. 4), a second receptive field input 506b, a third receptive field input 506c, and a fourth receptive field input 506d. Similar to the receptive field input 406 of FIG. 4, each of the receptive field inputs 506a, 506b, 506c, and 506d have a 1×5×2 dimension. Adjacent receptive field inputs of the receptive field inputs 506a, 506b, 506c, and 506d overlap and share some values. The multiple receptive field inputs 506a, 506b, 506c, and 506d can be respectively processed in the multiple (e.g., four) parallel CIM arrays 508a, 508b, 508c, and 508d simultaneously to process the input 502 in one fourth of the cycles required to process the input 402 by the architecture 400 of FIG. 4. The multiple parallel CIM arrays 508a, 508b, 508c, and 508d can simultaneously generate multiple receptive field outputs 510a, 510b, 510c, and 510d. For example, the convolution using the multiple parallel CIM arrays 508a, 508b, 508c, and 508d simultaneously takes only eighty five (85) cycles, as opposed to three hundred and forty (340) cycles for the architecture 400 of FIG. 4. Accordingly the overall energy usage of the neural network architecture 500 may be reduced using the parallel processing. Note that, although an exemplary implementation using four CIM arrays has been described above, alternative implementations may have any suitable number of CIM arrays working in parallel, with corresponding modifications.

Figure 6:
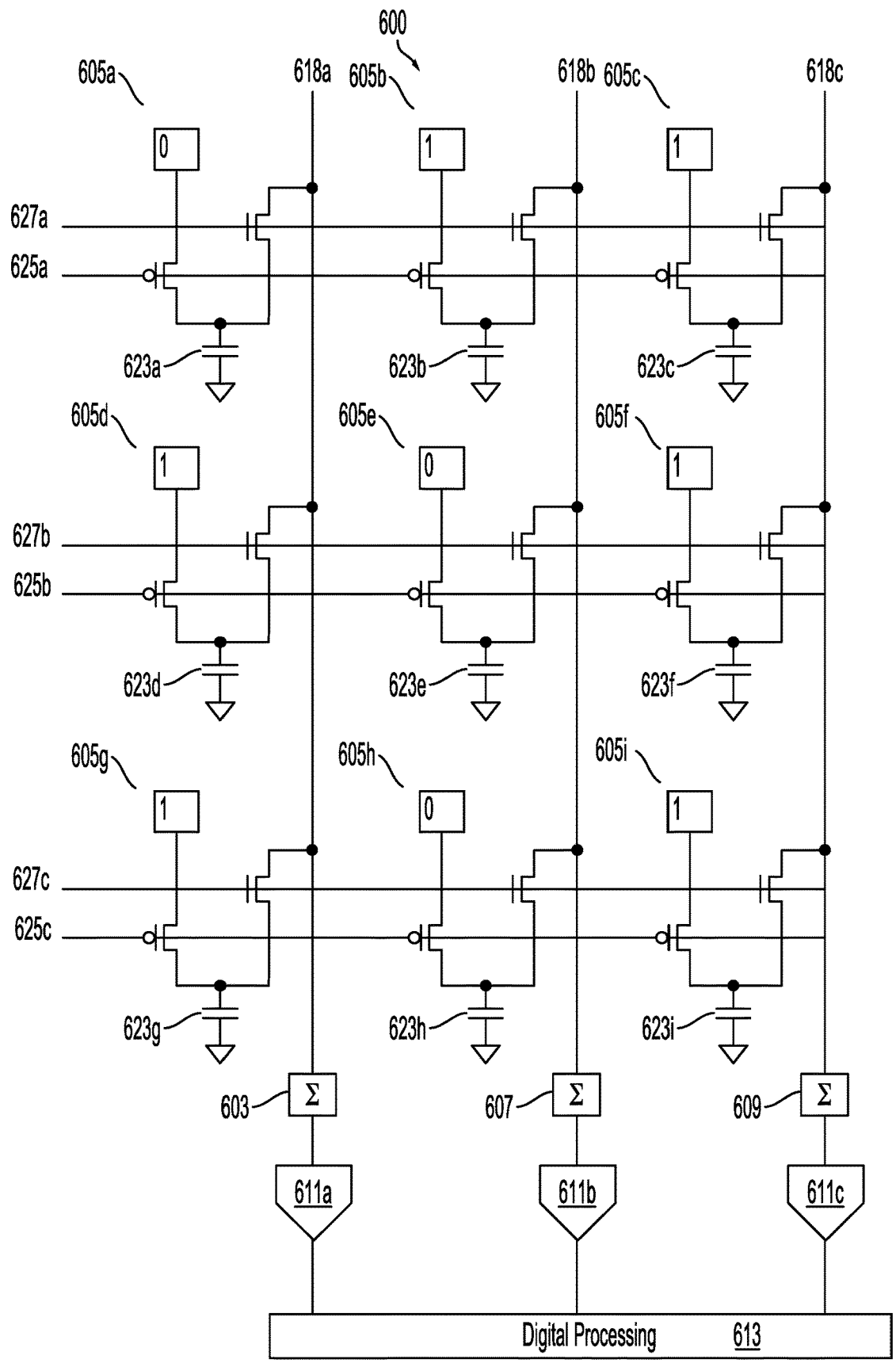
FIG. 6 illustrates an architecture of a compute-in-memory (CIM) array of an artificial neural network, according to aspects of the present disclosure.

FIG. 6 illustrates an exemplary architecture 600 of a compute-in-memory (CIM) array of an artificial neural network, according to aspects of the present disclosure. The compute-in-memory array can be used to implement the parallel processing techniques described above. Compute-in-memory is a technique for performing multiply and accumulate operations within a memory array. The storage unit is also a processing unit. The compute-in-memory array includes population count word lines (PCWLs) 625a, 625b and 625c, read word lines (RWLs) 627a, 627b, and 627c, analog-to-digital converters (ADCs) 611a, 611b and 611c, a digital processing unit 613, as well as bitlines 618a, 618b, and 618c. Weights (e.g., a binary synaptic weight matrix) are stored in SRAM cells. Exemplary binary weights are shown in the SRAM cells for illustration. FIG. 6 shows nine bitcells 605a-605i of the compute-in-memory array. Input activations (e.g., input values that may be an input vector) are provided on the PCWLs 625.

The multiplication occurs in each bit cell associated with a bitline and the accumulation (summation) of all the bit cell multiplication results occurs on the same bitline for one column. The multiplication in each bitcell is in the form of an AND operation of the corresponding activation and weight, where the product is stored as a charge on the corresponding capacitor 623. For example, a product of 1, and consequently a charge on the capacitor 623, is produced only where the activation is one (here, because a PMOS is used, the PCWL is zero for an activation of one) and the weight is one.

For example, the bitline 618a, according to this aspect, accumulates charge of all the bit cells in the first column. The accumulated or summed charges include summed charge 603 of bitline 618a, summed charge 607 of bitline 618b, and summed charge 609 of bitline 618c. The summed charge 603 of the bitline 618a is passed on to a comparator or ADC 611a where the summed charge 603 is converted to a digital output (e.g., digital signal/number), which is a next layer input of the neural network. The digital output in each bitline may or may not be added together depending on whether it is a single bit or multiple bit neural network (NN) operation. When activations on population count word lines (PCWLs) 625a, 625b and 625c are, for example, 1, 0, 1, then the sums of bitlines 618a-c are respectively 0+0+1=1, 1+0+ 0=1, and 1+0+1=2. The output of the ADCs 611a, 611b and 611c are passed on to the digital processing unit 613 for further processing.

Figure 7:
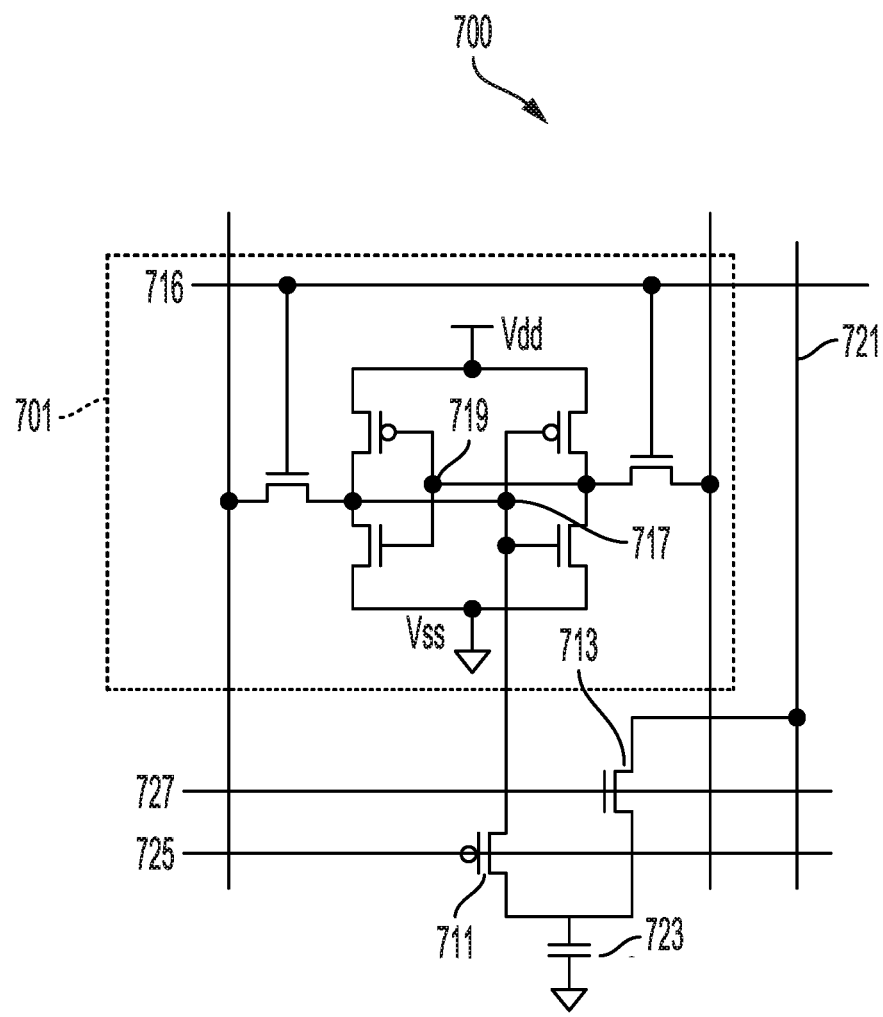
FIG. 7 illustrates a bit cell of a compute-in-memory array, according to aspects of the present disclosure.

FIG. 7 illustrates more detail of an exemplary bit cell 700 (e.g., the bitccell 605 of FIG. 6) of a compute-in-memory array, according to aspects of the present disclosure. For example a bitline 721 is similar to the bitline 618a, a capacitor 723 is similar to the capacitor 623, a read word line 727 is similar to the read word line 627a, and a population count word line 725 is similar to the population count word line 625a. The bit cell 700 includes a static random access memory (SRAM) cell 701 with additional transistors 711 (e.g., a PMOS transistor) and 713 (e.g., an NMOS transistor) as well as a capacitor 723 coupled to ground. Although a PMOS transistor is used for the transistor 711, other transistors (e.g., an NMOS transistor) can be used in place of the PMOS transistor, with corresponding adjustment (e.g., inversion) of their respective control signals. The same applies to the other transistores described herein. The additional transistors 711 and 713 are included to implement the compute-in-memory array, according to aspects of the present disclosure. In one aspect, the SRAM cell 701 is a conventional six transistor (6T) SRAM cell.

Programming of weights in the bitcell may be performed once for a multitude of activations. For example, in operation, the SRAM cell 701 receives only one bit of information at nodes 717 and 719 via a word line 716. For example, when the information received at node 717 is a "1" (e.g., high voltage), the other node 719 does not receive information or the information received at node 719 is a "0" (e.g., low voltage) Similarly, when the information received at node 717 is a "0", the information received at node 719 is a "1." The programming of weights may be followed by an an activation input and multiplication step to charge the capacitors in accordance with the corresponding products. The transistor 711 is activated by an activation signal (PCWL signal) through a population count word line (PCWL) 725 of the compute-in-memory array and the transistor 713 is activated by a signal (RWL signal) through another word line (e.g., a read word line (RWL) 727) of the compute-in-memory array. The read word line 727 is provided to all the bit cells in a row and is turned ON to accumulate the values of the bit cells.

If node 717 is a "0," (e.g., when the stored weight value is "0") the capacitor 723 will not be charged even a LOW PCWL indicates an activation of "1" at the gate of the transistor 711. Accordingly, no charge is provided to a bitline 721. However, if node 717, which corresponds to the weight value, is a "1", and PCWL is set to low (e.g., when the activation input is high), which turns on PMOS transistor 711, which acts as a short, allowing capacitor 723 to be charged. After the capacitor 723 is charged, the transistor 711 is turned off so the charge is stored in the capacitor 723.

To move the charge from the capacitor 723 to the bitline 721, the NMOS transistor 713 is turned on by RWL 727 causing the NMOS transistor 713 to act as a short.

Figure 8:
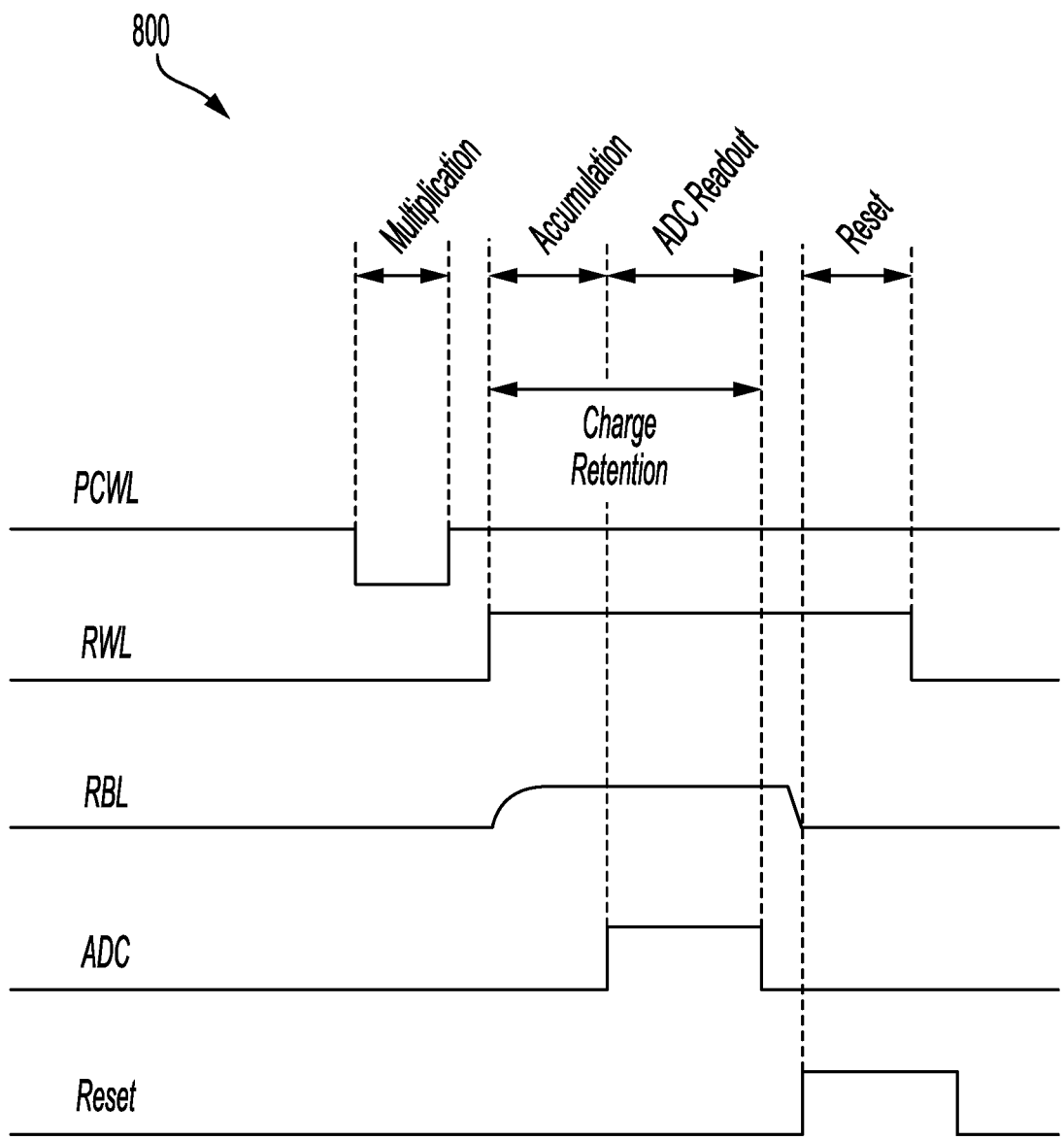
FIG. 8 shows a timing diagram for various signals of a compute-in-memory (CIM) array operation.

FIG. 8 shows a timing diagram 800 illustrating the timing of various signals during a compute-in-memory (CIM) array operation. A first row of the timing diagram 800 shows a population count word line PCWL (e.g., 625a of FIG. 6 or 725 of FIG. 7), going LOW. A LOW PCWL indicates an activation of "1." The PMOS transistor turns on when PCWL is LOW, which allows charging of the capacitor (if the weight is "1"). A second row shows a read word line RWL (e.g., read word line 627a of FIG. 6 or 727 of FIG. 7.) A third row shows a read bitline RBL (e.g. 618 or 721), a fourth row shows an analog-to-digital converter (ADC) readout signal and a fifth row shows a reset signal. For example, referring to the transistor 711 of FIG. 7, a charge from the capacitor 723 is gradually passed on to the read bitline RBL when the read word line RWL is HIGH.

A summed charge/current/voltage (e.g., 603 of FIG. 6 or charges summed from the bitline 721 of FIG. 7) is passed on to a comparator or ADC (e.g., the ADC 611a of FIG. 6) where the summed charge is converted to a digital output (e.g., digital signal/number). The summing of the charge may occur in an accumulation region of the timing diagram 800 and a readout from the ADC may be associated with the ADC readout region of the timing diagram 800. After the ADC readout is obtained, the reset signal discharges all of the capacitors (e.g., capacitors 623) in preparation for processing the next set of activation inputs.

TABLE 1

| Activation | PCWL | Cell Node (Weight) | Capacitor Node |
|---|---|---|---|
| 1 | 0 | 1 | 1 |
| 1 | 0 | 0 | 0 |
| 0 | 1 | 1 | 0 |
| 0 | 1 | 0 | 0 |

Table 1 illustrates an example of a compute-in-memory array operation. A first column of Table 1 includes possible values of an incoming activation signal. A second column includes PCWL that activates transistors designed to implement the compute-in-memory array according to aspects of the present disclosure. Because the transistor 711 is a PMOS transistor, the PCWL values are inverses of the activation values. For example, the compute-in-memory array includes the transistor 711 that is activated by an activation signal (PCWL signal) through the population count word line (PCWL) 725.

A third column includes multiple weights stored in SRAM cell nodes of the compute-in-memory array that correspond to a filter tensor. A fourth column shows the resultant products that will be stored as charge on a capacitor. For example, the charge may be stored at a node of the capacitor 723 or a node of one of the capacitors 623a-623i. The charge from the capacitor 723 is moved to the bitline 721 when the transistor 713 is activated. For example, referring to the transistor 711, when the weight at the cell node 717 is a "1" (e.g., high voltage) and the input activation is a "1" (so PCWL is "0"), the capacitor 723 is charged (e.g., the node of the capacitor is a "1"). For all other combinations, the capacitor node will have a value of 0.

The parallel processing techniques of the present disclosure can help with any type of edge computing involving artificial neural networking. The techniques have applicability at the inference stage or any other stage of neural network processing. Binary networks are applicable when high accuracy is not needed. Although the discussion was primarily with respect to binary neural networks, other low bit width neural networks are also contemplated.

Figure 9:
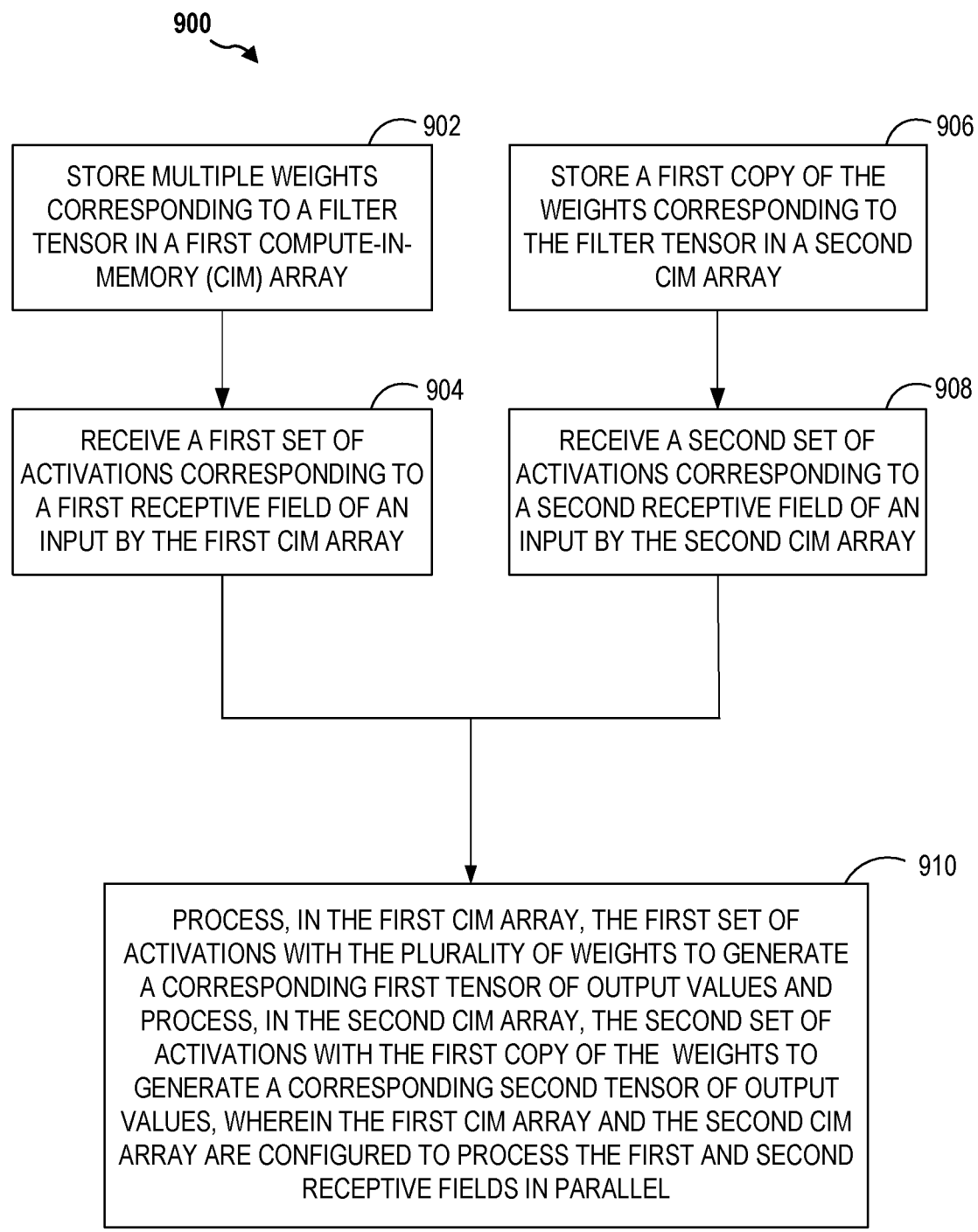
FIG. 9 illustrates a parallel processing method of a convolutional layer of a convolutional neural network, in accordance with aspects of the present disclosure.

FIG. 9 illustrates a parallel processing method 900 of a convolutional layer of a convolutional neural network, in accordance with aspects of the present disclosure. As shown in FIG. 9, at block 902, multiple weights corresponding to a filter tensor are stored in a first compute-in-memory array. At block 904, a first set of activations corresponding to a first receptive field of an input are received by the first compute-in-memory array. At block 906, a first copy of the weights corresponding to the filter tensor is stored in a second compute-in-memory array. At block 908, a second set of activations corresponding to a second receptive field of the input are received by the second compute-in-memory array. At block 910, the first set of activations are processed, in the first compute-in-memory array, with the weights to generate a corresponding first tensor of output values, and the second set of activations are processed, in the second compute-in-memory array, with the first copy of the weights to generate a corresponding second tensor of output values. The first compute-in-memory array and the second compute-in-memory array are configured to process the first receptive field and the second receptive field in parallel.

According to a further aspect of the present disclosure, a parallel processing apparatus for a convolutional layer of a convolutional neural network is described. The parallel processing apparatus includes first means for performing bitwise operations and bit counts on a set of activations. The first means includes the compute-in-memory array 408 or 508a, the deep convolutional network 200, the deep convolutional network 350, the convolutional layer 232, the SoC 100, the CPU 102, and/or the convolutional block 354A. The parallel processing apparatus further includes second means for performing bitwise operations and bit counts on the set of activations. The second means includes the compute-in-memory array 508b, the deep convolutional network 200, the deep convolutional network 350, the convolutional layer 232, the SoC 100, the CPU 102, and/or the convolutional block 354A.

The parallel processing apparatus further includes third means for performing bitwise operations and bit counts on the set of activations. The third means includes the compute-in-memory array 508c, the deep convolutional network 200, the deep convolutional network 350, the convolutional layer 232, the SoC 100, the CPU 102, and/or the convolutional block 354A. In another aspect, the aforementioned means may be any module or any apparatus configured to perform the functions recited by the aforementioned means.

The various operations of methods described above may be performed by any suitable means capable of performing the corresponding functions. The means may include various hardware and/or software component(s) and/or module(s), including, but not limited to, a circuit, an application specific integrated circuit (ASIC), or processor. Generally, where there are operations illustrated in the figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database or another data structure), ascertaining and the like. Additionally, "determining" may include receiving (e.g., receiving information), accessing (e.g., accessing data in a memory) and the like. Furthermore, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present disclosure may be implemented or performed with a general-purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, erasable programmable read-only memory (EPROM), electrically erasable programmable read-only memory (EEPROM), registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a device. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may connect a network adapter, among other things, to the processing system via the bus. The network adapter may implement signal processing functions. For certain aspects, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processor may be responsible for managing the bus and general processing, including the execution of software stored on the machine-readable media. The processor may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, random access memory (RAM), flash memory, read only memory (ROM), programmable read-only memory (PROM), erasable programmable read-only memory (EPROM), electrically erasable programmable Read-only memory (EEPROM), registers, magnetic disks, optical disks, hard drives, or any other suitable storage medium, or any combination thereof. The machine-readable media may be embodied in a computer-program product. The computer-program product may comprise packaging materials.

In a hardware implementation, the machine-readable media may be part of the processing system separate from the processor. However, as those skilled in the art will readily appreciate, the machine-readable media, or any portion thereof, may be external to the processing system. By way of example, the machine-readable media may include a transmission line, a carrier wave modulated by data, and/or a computer product separate from the device, all which may be accessed by the processor through the bus interface. Alternatively, or in addition, the machine-readable media, or any portion thereof, may be integrated into the processor, such as the case may be with cache and/or general register files. Although the various components discussed may be described as having a specific location, such as a local component, they may also be configured in various ways, such as certain components being configured as part of a distributed computing system.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may comprise one or more neuromorphic processors for implementing the neuron models and models of neural systems described herein. As another alternative, the processing system may be implemented with an application specific integrated circuit (ASIC) with the processor, the bus interface, the user interface, supporting circuitry, and at least a portion of the machine-readable media integrated into a single chip, or with one or more field programmable gate arrays (FPGAs), programmable logic devices (PLDs), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The machine-readable media may comprise a number of software modules. The software modules include instructions that, when executed by the processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module. Furthermore, it should be appreciated that aspects of the present disclosure result in improvements to the functioning of the processor, computer, machine, or other system implementing such aspects.

If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Additionally, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For certain aspects, the computer program product may include packaging material.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. An apparatus comprising:
 a first compute-in-memory array configured:
  to store a plurality of weights corresponding to a filter tensor;
  to receive a first set of activations corresponding to a first receptive field of an input; and
  to process the first set of activations with the plurality of weights to generate a corresponding first tensor of output values; and
 a second compute-in-memory array configured:
  to store a first copy of the plurality of weights corresponding to the filter tensor;
  to receive a second set of activations corresponding to a second receptive field of the input; and
  to process the second set of activations with the first copy of the plurality of weights to generate a corresponding second tensor of output values, wherein the first compute-in-memory array and the second compute-in-memory array are configured to process the first receptive field and the second receptive field in parallel.

2. The apparatus of claim 1, in which the first compute-in-memory array and the second compute-in-memory array are configured to perform parallel convolutional layer multiply and accumulate (MAC) functions simultaneously on the first receptive field and the second receptive field.

3. The apparatus of claim 2, in which the parallel convolutional layer multiply and accumulate functions comprise an analog process in the first compute-in-memory array and the second compute-in-memory array.

4. The apparatus of claim 1, in which the apparatus is for a convolutional neural network and the convolutional neural network comprises a binary neural network.

5. The apparatus of claim 1, in which the filter tensor comprises a plurality of filters corresponding to output channels of a convolutional neural network layer.

6. The apparatus of claim 1, further comprising:
 a third compute-in-memory array configured:
  to store a second copy of the plurality of weights corresponding to the filter tensor;
  to receive a third set of activations corresponding to a third receptive field of the input; and
  to process the third set of activations with the second copy of the plurality of weights to generate a corresponding third tensor of output values, the first compute-in-memory array, the second compute-in-memory array, and the third compute-in-memory array configured to process the first, second, and third receptive fields in parallel.

7. The apparatus of claim 1, wherein the processing of the first set of activations and the second set of activations comprises bitwise operations and bit counts.

8. A processing method for a convolutional layer of a convolutional neural network, comprising:
 storing a plurality of weights corresponding to a filter tensor in a first compute-in- memory array;

receiving a first set of activations corresponding to a first receptive field of an input by the first compute-in-memory array;

storing a first copy of the plurality of weights corresponding to the filter tensor in a second compute-in-memory array;

receiving a second set of activations corresponding to a second receptive field of the input by the second compute-in-memory array; and processing, in the first compute-in-memory array, the first set of activations with the plurality of weights to generate a corresponding first tensor of output values and processing, in the second compute-in-memory array, the second set of activations with the first copy of the plurality of weights to generate a corresponding second tensor of output values, wherein the first compute-in-memory array and the second compute-in-memory array are configured to process the first receptive field and the second receptive field in parallel.

9. The method of claim 8, wherein the filter tensor comprises plurality of filters corresponding to output channels of a convolutional neural network layer.

10. The method of claim 8, wherein the processing of the first set of activations and the second set of activations comprises bitwise operations and bit counts.

11. The method of claim 8, further comprising performing parallel convolutional layer multiply and accumulate (MAC) functions in the first compute-in-memory array and the second compute-in-memory array respectively on the first receptive field and the second receptive field.

12. The method of claim 11, in which the parallel convolutional layer multiply and accumulate functions comprise an analog process in the first compute-in-memory array and the second compute-in-memory array.

13. The method of claim 8, further comprising:

storing a second copy of the plurality of weights corresponding to the filter tensor in a third compute-in-memory array;

receiving a third set of activations corresponding to a third receptive field of the input; and processing the third set of activations with the second copy of the plurality of weights to generate a corresponding third tensor of output values, the first compute-in-memory array, the second compute-in-memory array, and the third compute-in-memory array configured to process the first, second, and third receptive fields in parallel.

14. The method of claim 8, in which the convolutional neural network comprises a binary neural network.

15. An apparatus, comprising:

first means for performing bitwise operations and bit counts on a set of activations, the first means configured:

to store a plurality of weights corresponding to a filter tensor ;

to receive a first set of activations corresponding to a first receptive field of an input; and to process the first set of activations with the plurality of weights to generate a corresponding first tensor of output values; and second means for performing bitwise operations and bit counts on the set of activations, the first means configured:

to store a first copy of the plurality of weights corresponding to the filter tensor;

to receive a second set of activations corresponding to a second receptive field of the input; and to process the second set of activations with the first copy of the plurality of weights to generate a corresponding second tensor of output values, wherein the first means and the second means are configured to process the first receptive field and the second receptive field in parallel.

16. The apparatus of claim 15, in which the first means and the second means are configured to perform parallel convolutional layer multiply and accumulate (MAC) functions simultaneously on the first receptive field and the second receptive field.

17. The apparatus of claim 16, in which the parallel convolutional layer multiply and accumulate functions comprise an analog process in the first means and the second means.

18. The apparatus of claim 15, in which the apparatus is for a convolutional neural network and the convolutional neural network comprises a binary neural network.

19. The apparatus of claim 15, wherein the filter tensor comprises plurality of filters corresponding to output channels of a convolutional neural network layer.

20. The apparatus of claim 15, further comprising:

third means for performing bitwise operations and bit counts on the set of activations, the third means configured:

to store a second copy of the plurality of weights corresponding to the filter tensor;

to receive a third set of activations corresponding to a third receptive field of the input; and to process the third set of activations with the second copy of the plurality of weights to generate a corresponding third tensor of output values, wherein the first means, the second means, and the third means are configured to process the first, second, and third receptive fields in parallel.

* * * * *